(12) United States Patent
Kim (10) Patent No.: US 8,111,574 B2
(45) Date of Patent: Feb. 7, 2012

(54) CIRCUIT AND METHOD FOR CONTROLLING SELF-REFRESH CYCLE

(75) Inventor: Kwi Dong Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 372 days.

(21) Appl. No.: 12/535,069

(22) Filed: Aug. 4, 2009

(65) Prior Publication Data

US 2009/0323449 A1    Dec. 31, 2009

Related U.S. Application Data

(62) Division of application No. 11/647,763, filed on Dec. 29, 2006, now Pat. No. 7,619,943.

(30) Foreign Application Priority Data

May 22, 2006  (KR) .................. 10-2006-0045861

(51) Int. Cl.
*G11C 7/00*     (2006.01)
(52) U.S. Cl. ........................ 365/222; 365/201
(58) Field of Classification Search .............. 365/222, 365/201, 210
See application file for complete search history.

(56) References Cited

U.S. PATENT DOCUMENTS

| | | | |
|---|---|---|---|
| 5,365,487 A | 11/1994 | Patel et al. | |
| 5,453,959 A | 9/1995 | Sakuta et al. | |
| 5,652,729 A * | 7/1997 | Iwata et al. | 365/222 |
| 5,717,652 A | 2/1998 | Ooishi | |
| 6,075,739 A * | 6/2000 | Ihara | 365/222 |
| 7,113,440 B2 * | 9/2006 | Lee et al. | 365/222 |
| 7,260,011 B2 | 8/2007 | Riho et al. | |

FOREIGN PATENT DOCUMENTS

| | | |
|---|---|---|
| KR | 1996-0032486 A | 9/1996 |
| KR | 1020000065430 A | 11/2000 |

OTHER PUBLICATIONS

USPTO Office Action mailed Mar. 09, 2009 for parent U.S. Appl. No. 11/647,763.

* cited by examiner

*Primary Examiner* — Anh Phung
(74) *Attorney, Agent, or Firm* — Ladas & Parry LLP

(57) ABSTRACT

The present invention relates to a circuit and a method for controlling a self-refresh cycle of a dynamic random access memory or DRAM. A cell voltage is directly detected so that a self-refresh cycle can be variably controlled. Detectors each detecting whether or not a voltage charged into a capacitor of a detection cell drops to or below a reference voltage and outputs a detection signal. A pulse generator generates a self-refresh pulse while being linked with an enabled detection signal of the plurality of detectors. A self-refresh cycle can be variably controlled and set to be suitable for the charging capacity of a cell. The detection cell is adapted to the change of the charging capacity of the cell in accordance with a change in temperature.

21 Claims, 5 Drawing Sheets

CIRCUIT AND METHOD FOR CONTROLLING SELF-REFRESH CYCLE

TECHNICAL FIELD

The present invention relates to a semiconductor memory device, and more particularly to a circuit and a method for controlling a self-refresh cycle in a semiconductor memory device.

BACKGROUND ART

In general, a dynamic random access memory or DRAM is a semiconductor memory device using one capacitor and one transistor as data storage unit or unit cell. A logic one bit or "data" is saved in a DRAM as a charge in the capacitor. The transistor serves as a switch when reading and writing the "data" charged into the capacitor.

Figure 1:
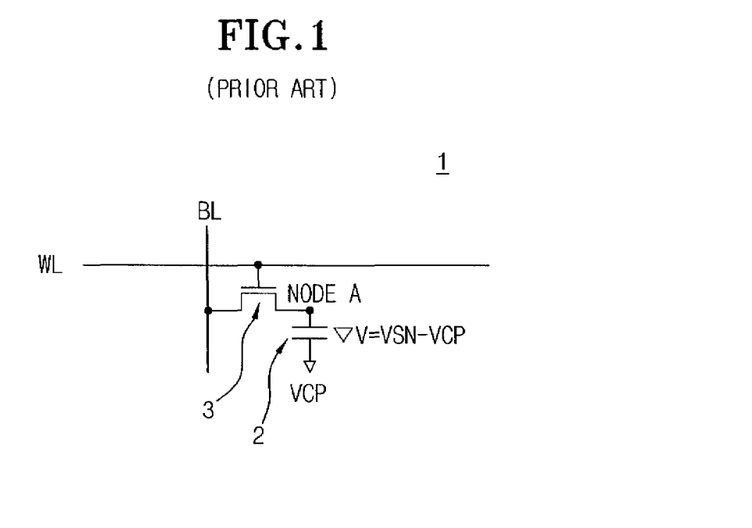
FIG. 1 is a view showing a general cell and prior art configuration of a DRAM.

A general cell 1 of a DRAM is configured as shown in FIG. 1. In order to charge or save a logic one or "high" data value into a capacitor 2 of the unit cell 1, a high voltage is applied through a word line WL such that the transistor 3 can be turned on. When the transistor 3 is turned on, a "high" voltage or "data" is applied to node A (storage node) through a bit line BL. Thereafter, if the "high" data is charged into the capacitor 2, the voltage applied through the word line WL is changed into "low," and the transistor 3 is turned off.

In the capacitor 2, however, the data charge is maintained over a limited time period due to leakage current. That is, charges stored in the capacitor 2 leak, causing the voltage VSN at node A to gradually decrease over time. Thus, in order to be able to read data from a DRAM, the voltage difference between both sides or plates of the capacitor, i.e., the voltage difference $\Delta V$ between a voltage VSN at node A and a cell plate voltage VCP, should be maintained as at least a minimum voltage $\Delta VMIN$ that is capable of being sensed by a sense amplifier.

Over time, the charge in the capacitor will leak until and the voltage difference $\Delta V$ between both ends of the capacitor becomes less (lower) than the minimum voltage $\Delta VMIN$ capable of being sensed by the sense amplifier after a certain period of time. In order to reduce such a phenomenon, the DRAM performs a refresh operation in which the charge on the capacitor 2 is actually restored or replenished, i.e., "refreshed."

A In the self-refresh mode, a DRAM automatically performs a refresh operation for each predetermined cycle such that data in each cell can be maintained in a capacitor 2 of a cell.

For example, assuming that the self-refresh cycle time of a DRAM is 64•, a refresh operation is performed for each corresponding cycle. Accordingly, the voltage difference $\Delta V$ between both sides of a capacitor of a cell is refreshed at a level of the minimum voltage $\Delta VMIN$ or more, which can be sensed by a sense amplifier, for each at least 64•.

A self-refresh cycle is determined to be a predetermined cycle by expecting the charging capacity of a cell in advance. However, if a refresh cycle is too long or too short as compared with the substantial charging capacity of a cell, there might be a problem in that the capacity of the cell is not appropriately used, or a large amount of current is consumed.

Further, in a case where a refresh cycle is changed depending on a temperature, there is required a circuit generating pulses for controlling a change in refresh cycle by sensing a temperature, and a self-refresh circuit occupies an additional area as large as the circuit. Therefore, there is a problem in that efficiency is lowered in view of a cell layout.

SUMMARY OF THE INVENTION

It is an object of the present invention to provide a circuit and a method for controlling a self-refresh cycle, wherein a cell voltage is detected directly so that a self-refresh cycle can be variably controlled.

It is another object of the present invention to provide a circuit and a method for controlling a self-refresh cycle, wherein dummy cells are arranged to detect the voltage of each of the dummy cell so that a self-refresh cycle can be variably controlled without considering the configuration of a circuit detecting a change in temperature.

A circuit for controlling a self-refresh cycle according to the present invention includes: a plurality of detectors each detecting whether or not a voltage charged into a capacitor of a detection cell drops to a reference voltage or less to output a detection signal; and a pulse generator generating a self-refresh pulse for performing self refresh while being linked with an enabled detection signal of the plurality of detectors.

The detection cell may be comprised of a dummy cell. The reference voltage may be set to be a minimum sensing voltage VMIN, capable of being sensed by a sense amplifier. The detector may include a differential amplifier comparing a voltage in which the voltage at a storage node of the detection cell is dropped as low as the minimum sensing voltage with a cell plate voltage so as to output the detection signal The detector may be driven in accordance with a control signal, and the detector may further include an initialization circuit, initializing an output terminal of the differential amplifier in accordance with a reset signal. The detector further includes a latch, which latching an output signal (a voltage) of the differential amplifier The pulse generator may include a detection signal input unit generating a detection pulse with an enable state linked with an enabled detection signal of the plurality of detectors. A delay unit outputs a delay detection pulse in which the detection pulse is delayed by a predetermined time. A self-refresh pulse generator performs an exclusive OR operation on the detection pulse and the delay detection pulse the result of which the self-refresh pulse.

The detection signal input unit may include a plurality of NAND gates grouping the detection signals of the plurality of detectors to perform a NAND operation. A NOR gate performs a NOR operation on the signals output from the plurality of NAND gates. The output of the NOR gate is the detection pulse.

It is preferred that the predetermined time is a time corresponding to the width interval of the self-refresh pulse.

The self-refresh pulse generator may include a first NAND gate performing a NAND operation on the detection pulse and the delay detection pulse. First and second inverters respectively invert the detection pulse and the delay detection pulse. A second NAND gate performs a NAND operation with respect to outputs of the first and second inverters. A third NAND gate performs a NAND operation on outputs of the first and second NAND gates. A NOR gate performs a NOR operation with respect to the detection pulse and an output of the third NAND gate.

The detector may further include a detector selection circuit receiving a test mode signal and an address signal to apply the control signal to a detector corresponding to the address signal among the plurality of detectors.

The detector selection circuit includes a fuse box having a plurality of fuses, and outputs the control signal in an enable state corresponding to the cut fuse.

A method for controlling a self-refresh cycle according to the present invention, which includes: a first step of comparing each voltage charged into capacitors of a plurality of detection cells to output a plurality of detection signals corresponding to the compared results; and a second step of generating a self-refresh pulse for performing self refresh while being linked with at least one of the plurality of enabled detection signals.

Preferably, the reference voltage in the first step is set to be a minimum sensing voltage capable of being sensed by a sense amplifier.

The detection signal in the first step may be output by comparing a voltage in which the voltage at a storage node of the detection cell is dropped as low as the minimum sensing voltage with a cell plate voltage.

The detection signal in the first step may be latched to be output.

Further, the second step may include the steps of: receiving the plurality of detection signals to generate a detection pulse by at least one or more enabled detection signals; outputting the detection pulse to the delay detection pulse by delaying for a certain period time; and performing an exclusive OR operation with respect to the detection pulse and the delay detection pulse to generate the self-refresh pulse.

Preferably, the detection pulse is output by grouping the plurality of detection signals to perform a plurality of NAND operations and performing a NOR operation with respect to the plurality of NAND-operated output signals.

Preferably, the delay detection pulse is output by delaying the detection pulse by the width of the self-refresh pulse.

The exclusive OR operation may include the steps of: performing a first NAND operation with respect to the detection pulse and the delay detection pulse; inverting the respective detection pulse and delay detection pulse to perform a second NAND operation; performing a third NAND operation with respect to the first and second NAND-operated signals; and performing a NOR operation with respect to the detection pulse and the third NAND-operated signal to output the self-refresh pulse.

Another method for controlling a self-refresh cycle according to the present invention includes: a first step of receiving a test mode signal and an address signal to output an enable control signal corresponding to the address signal; a second step of detecting whether or not a voltage charged into a capacitor of a detection cell selected by the enable control signal among a plurality of detection cells drops to a reference voltage or less to be output as a detection signal; and a third step of generating a self-refresh pulse in accordance with the detection signal.

The enable control signal may be applied as a disable state using a cut fuse according to a refresh cycle determined as the self-refresh pulse.

The first to fourth steps may be performed for detection cells sequentially selected by the address.

Further, the reference voltage in the second step may be a minimum sensing voltage capable of being sensed by a sense amplifier.

The second step may include a step of comparing a voltage in which the voltage at a storage node of the detection cell is dropped as low as the minimum sensing voltage with a cell plate voltage of the detection cell so as to output the detection signal.

Another circuit for controlling a self-refresh cycle according to the present invention includes: a plurality of dummy cell; a plurality of detectors each outputting a signal corresponding to the charging state of a corresponding dummy cell; and a pulse generator outputting a self-refresh pulse in response to output signals of the plurality of detectors.

The detector may include a differential amplifier comparing a voltage in which the voltage at a storage node of the dummy cell is dropped as low as the minimum sensing voltage capable of being sensed by a sense amplifier with a cell plate voltage to output the detection signal.

The pulse generator may include: a detection signal input unit receiving the output signals of the plurality of detectors to generate a detection pulse by an output signal first enabled; a delay unit outputting a delay detection pulse in which the detection pulse is delayed by a predetermined time; and a self-refresh pulse generator performing an exclusive OR operation with respect to the detection pulse and the delay detection pulse to generate the self-refresh pulse.

The circuit for controlling a self-refresh cycle may further include a detector selector receiving a test mode signal and an address signal to apply a control signal to a detector corresponding the address signal among the plurality of the detectors, wherein the detector is driven by the control signal.

DETAILED DESCRIPTION OF THE PREFERRED EMBODIMENTS

Hereinafter, preferred embodiments of the present invention will be described in detail with reference to the accompanying drawings.

Figure 2:
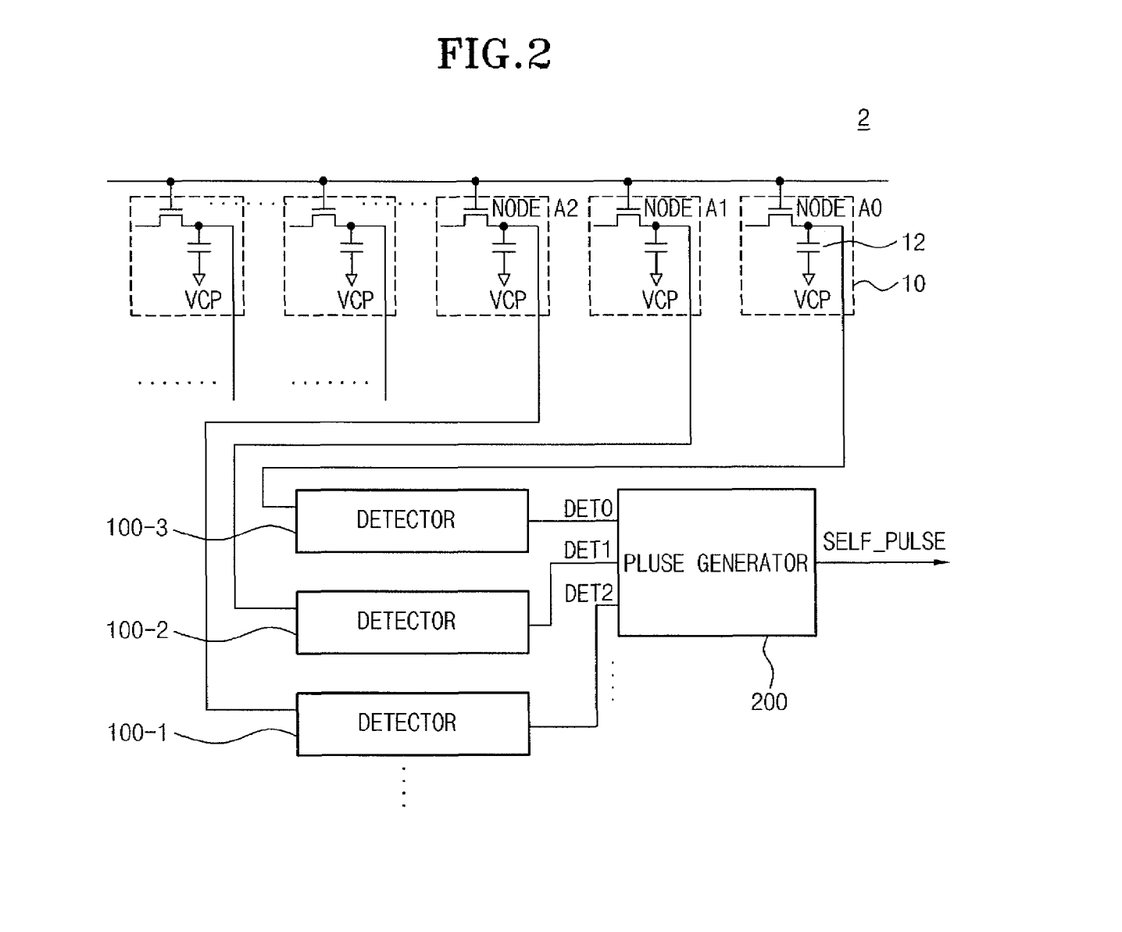
FIG. 2 is a block diagram of a circuit for controlling a self-refresh cycle according to an embodiment of the present invention.

FIG. 2 shows aA circuit for controlling a self-refresh cycle of a DRAM. The circuit 2 includes detection cells 10; a plurality of detectors 100-1, 100-2 and 100-3 each of which detects whether or not a voltage charged into a capacitor of each of the detection cells 10 drops to a reference voltage or less. The detection cells 10 output detection signals DET0, DET1, DET2, . . . ; to a pulse generator 200 that generates a self-refresh pulse SELF_PULSE output signal.

A voltage ΔV is charged into the capacitor 12 of each of the detection cells 10 that is equal to the voltage difference between the voltage at storage nodes NODE A0, NODE A1, NODE A2, . . . and a cell plate voltage VCP. Further, a reference voltage applied to the detector 100 may be set to be a minimum sensing voltage VMIN capable of being sensed by a sense amplifier (not shown).

Figure 3:
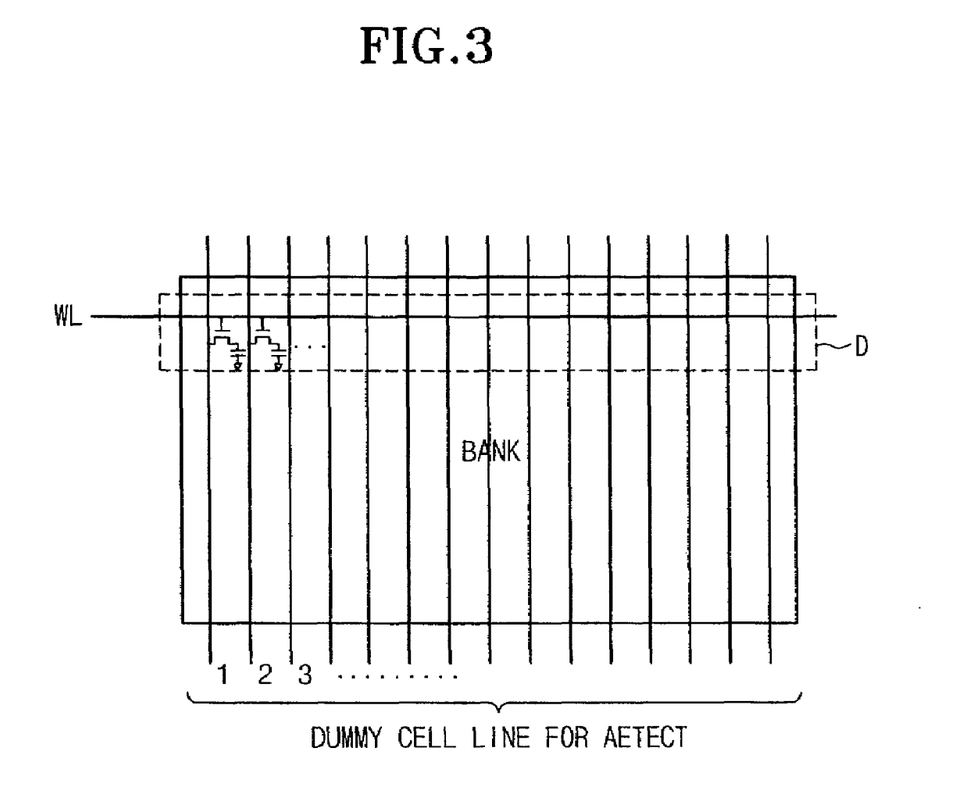
FIG. 3 is a view showing a layout of detection cells used in the circuit for controlling a self-refresh cycle in FIG. 2.

FIG. 3 shows a layout of detection cells 10 used in the circuit shown in FIG. 2. As shown in FIG. 3, it is preferred that the detection cells used in the circuit for controlling a self-refresh cycle are a plurality of dummy cells simultaneously turned on if a word line WL is enabled.

Only one unit cell 10 may be used in a dummy cell D used as the detection cells 10. Since a refresh cycle is determined by directly detecting a voltage ΔV charged into a capacitor of a dummy cell in the present invention, it is better that dummy cells used as the detection cells 10 are as many as possible. The number of dummy cells used as the detection cells 10 may be appropriately selected in a range where a refresh operation can be stably performed by the experimental results. Further, it is preferred that at least one or more word lines used in the circuit for controlling a self-refresh cycle are included for each bank.

Although using a dummy cell as a detection cell has been illustrated in this embodiment, it is not limited thereto. That is, cells to be used in the circuit for controlling a self-refresh cycle may be additionally produced and used.

Figure 4:
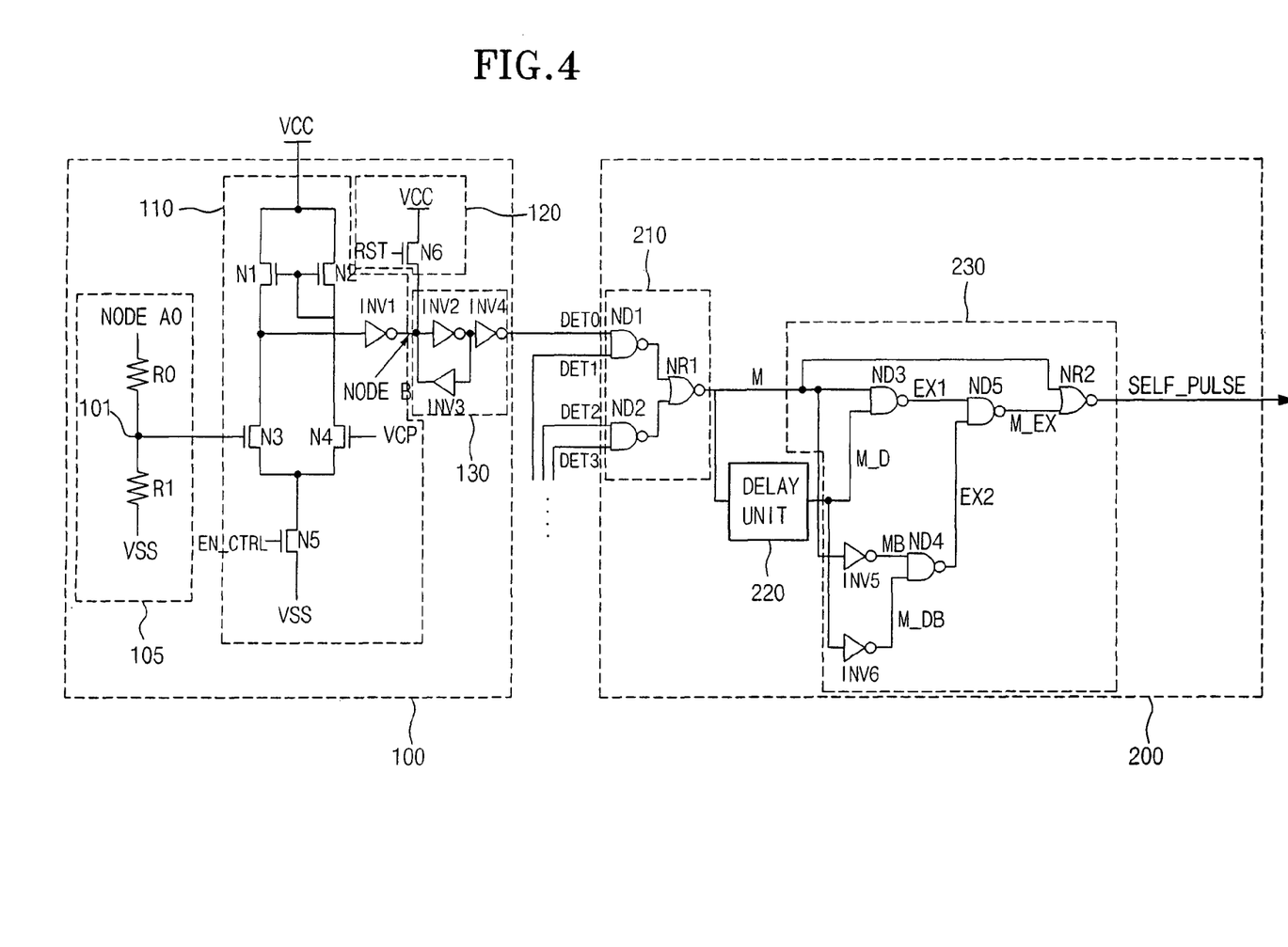
FIG. 4 is a detailed circuit diagram of the circuit for controlling a self-refresh cycle in FIG. 2.

FIG. 4 is a more detailed circuit diagram of the circuit for controlling a self-refresh cycle in FIG. 2. The detector 100 includes a voltage drop unit 105 generating a detection voltage in which a voltage VSN at a storage node NODE A0 of a detection cell 10 is dropped as low as a minimum sensing voltage VMIN. A differential amplifier 110 is driven by an enable control signal EN_CTRL and compares the detection voltage with a cell plate voltage VCP of the detection cell 10 to output a detection signal DET0. An initialization circuit 120 initializes the output terminal NODE B of the differential amplifier 110 by a reset signal RST. A latch 130 latches or holds the output signal or voltage of the differential amplifier 110.

A voltage ΔV charged into a capacitor of the detection cell 10 is more than a difference between a voltage VSN at the storage node NODE A0 of the detection cell and a cell plate voltage VCP. Thus, the voltage VSN at the storage node NODE A0 of the detection cell 10 is dropped as low as the minimum sensing voltage VMIN by the voltage drop unit 105, and the voltage dropped in the detection cell 10 is compared with the cell plate voltage VCP of the detection cell 10, so that there can be obtained the compared result of the voltage ΔV charged into the capacitor of the detection cell and the minimum sensing voltage VMIN.

The voltage drop unit 105 includes resistors R0 and R1 connected in series between the storage node NODE A0 and a ground voltage VSS. A detection voltage 101 is applied to the node between the resistors R0 and R1.

The differential amplifier 110 includes NMOS transistors N1 and N2. A power source voltage VCC is applied to the transistor drains. The gates of these transistors are commonly connected to each other. NMOS transistors N3 and N4, to which a detection voltage of the voltage drop unit 105 and a cell plate voltage VCP of the detection cell are respectively applied to gates of transistors N3 and N4. The drain terminals are respectively connected to source terminals of the NMOS transistors N1 and N2. An NMOS transistor N5 receives an enable control signal, EN_CTRL applied to the gate terminal. A ground voltage is applied to its source terminal. The source terminals of the NMOS transistors N3 and N4 are commonly connected to a drain. Here, the gate and source of the NMOS transistor N2 are commonly connected to each other. Further, the differential amplifier 110 includes an inverter INV1 connected to a connection node between the source of the NMOS transistor N1 and the drain of the NMOS transistor N3.

The initialization circuit 120 includes an NMOS transistor N6 in which an operation voltage VCC is applied to the drain A reset signal, RST, is inputted to a gate. The output terminal NODE B of the differential amplifier 110, that is, the output terminal of the inverter INV1, is connected to the source of N6. When node NODE B of the circuit for controlling a self-refresh cycle floats in a power-up operation interval of a semiconductor memory, the reset signal RST is used to initialize the node.

Preferably, the latch 130 has a structure in which an input terminal and an output terminal of two inverters INV2 and INV 3 are connected to each other. The latch further includes an inverter INV4 inverting the phase of an output signal.

The pulse generator 200 includes a detection signal input unit 210 generating an enable signal linked with a detection signal, i.e., a detection pulse M, if any one of detection signals DET0, DET1, DET2, DET3, . . . detected in the plurality of detectors 100 is enabled; a delay unit 220 outputting a delay detection pulse M_D in which a detection pulse M is delayed by a predetermined time; and a self-refresh pulse generator 230 performing an exclusive OR operation with respect to a detection pulse M and a delay detection pulse M_D so as to generate a self-refresh pulse SELF_PULSE.

It is preferred that the predetermined time, by which a detection pulse M is delayed, is a time corresponding to the width interval of a self-refresh pulse SELF_PULSE.

The detection signal input unit 210 includes a plurality of NAND gates ND1, ND2, . . . each of which receives detection signals (DET0, DET1; DET2, DET3; . . . ) from the plurality of detectors to perform a NAND operation on them. A NOR gate NR1 receives output signals inputted from the plurality of NAND gates ND1, ND2, . . . and performs a NOR operation. The output of the NOR gate is the detection pulse M.

The self-refresh pulse generator 230 includes a NAND gate ND3 performing a NAND operation with respect to a detection pulse M and a delay detection pulse M_D; inverters INV5 and INV6 inverting the phases of a detection pulse M and a delay detection pulse M_D; a NAND gate ND4 performing a NAND operation with respect to outputs of the inverters INV5 and INV6; a NAND gate ND5 a NAND operation with respect to outputs of the NAND gates ND3 and ND4; and a NOR gate NR2 performing a NOR operation with respect to a detection pulse M and an output of the NAND gate ND5. The self-refresh pulse generator 230 has a configuration in which an exclusive OR operation is consequently performed with respect to a detection pulse M and a delay detection pulse M_D. The self-refresh pulse generator 230 shown in FIG. 4 illustrates an example of an exclusive OR circuit.

The detector 100 in the aforementioned configuration detects whether or not a voltage ΔV charged into the capacitor of the detection cell 10 drops to a minimum sensing voltage VMIN or less. Further, the detector 100 drops a voltage VSN at the storage node NODE A0 of the detection cell by the minimum sensing voltage VMIN to apply it to the gate of the NMOS transistor N3 in the differential amplifier 110.

The relationship between the voltage ΔV charged into the capacitor of the detection cell, the voltage VSN at the storage node NODE A0, the minimum sensing voltage VMIN, the cell plate voltage VCP and the voltage VG applied to the gate of the NMOS transistor N3, is expressed by the following equation 1:

$$\Delta V = VSN - VCP,$$

$$VG = VSN - VMIN \rightarrow VMIN = VSN - VG,$$

$$\Delta V - VMIN = VG - VCP \qquad (1)$$

Referring to the equation 1, the compared result of the voltage ΔV charged into the capacitor of the detection cell and minimum sensing voltage VMIN can be obtained by comparing the cell plate voltage VCP with the voltage VG applied to the gate of the NMOS transistor N3. That is, in a case where the cell plate voltage VCP is larger than the voltage VG applied to the gate of the NMOS transistor N3, the voltage ΔV charged into the capacitor of the detection cell is smaller than the minimum sensing voltage VMIN.

In a case where the cell plate voltage VCP is larger than the voltage VG applied to the gate of the NMOS transistor N3, the differential amplifier 110 of the detector 100 outputs a detection signal DET0, DET1, DET2, DET 3, . . . in a "low" state. Accordingly, the detector 100 can detect whether or not the voltage ΔV charged into the capacitor of the detection cell drops to the minimum sensing voltage VMIN or less through the comparison of the cell plate voltage VCP and the voltage VG applied to the gate of the NMOS transistor N3.

Meanwhile, since the detection cell 10 is not a cell used in charging data but a cell detecting whether or not the voltage ΔV charged into the capacitor of the detection cell drops to the minimum sensing voltage VMIN or less, it is preferred that a "high" data be inputted in initialization.

Further, the pulse generator 200 outputs detection signals DET0, DET1, DET2, DET 3, . . . respectively detected from the corresponding detection cells 10 by the plurality of detector as a self-refresh pulse.

It is assumed that the detection signals DET 1, DET 2, DET0 and DET3 are sequentially enabled as a "low" state. Here, the order of the detection signals enabled as a "low" state is the same as that of the voltages ΔV charged into the capacitors of the four detection cells, which drop to the minimum sensing voltage VMIN.

Figure 5:
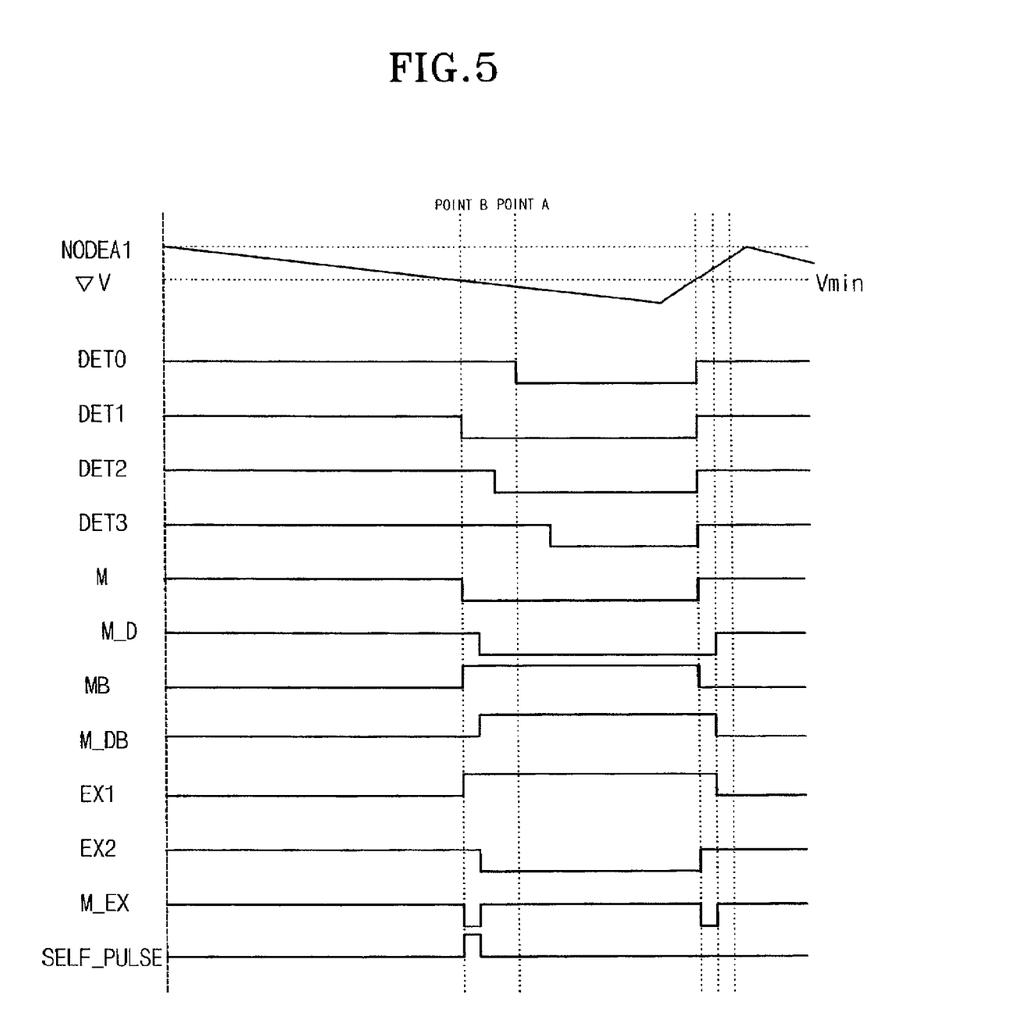
FIG. 5 is a timing diagram for explaining an operation of a pulse generator in FIG. 3.

Referring to FIG. 5, the voltage ΔV charged into the capacitor of the storage node NODE A1 becomes identical with the minimum sensing voltage VMIN at POINT B. Thus, the corresponding detector 100 senses the charged voltage of the storage node NODE A1 and changes the detection signal DET1 into a "low" state. Meanwhile, in a point A (POINT A), the voltage ΔV charged into the capacitor of the storage node NODE A0 becomes identical with the minimum sensing voltage VMIN. Thus, the corresponding detector 100 senses the charged voltage of the storage node NODE A0 and changes the detection signal DET0 into a "low" state. The other detection signals DET2 and DET3 are also changed into a "low" state through the same process.

The detection signal input unit 210 outputs a signal first changed into "low" among the detection signals DET0, DET1, DET2 and DET 3 as a "low" state. For example, the detection signal input unit 210 outputs the detection pulse M as a "low" state by the detection signal DET1. The detection signal input unit 210 may maintain the detection pulse M as a "low" state until all the detection signals DET0, DET1, DET2 and DET 3 are changed into a "high" state. This means that the capacitor of the detection cell is refreshed by the refresh pulse signal of the pulse generator 200 such that a voltage more than the minimum sensing voltage VMIN is charged into the capacitor of the detection cell, again.

Meanwhile, the self-refresh generator 230 performs a logical operation with respect to the detection pulse M and the delay detection pulse M_D passing through the delay unit 220 to output an output signal M_EX with a pulse width corresponding to delay time through the NAND gate ND5.

At this time, in the output signal M_EX of the NAND gate ND5, there are pulses not only when the detection pulse M is changed from "high" to "low" states but also when the detection pulse M is changed from "low" to "high" states. The NOR gate NR2 performs a NOR operation with respect to the detection pulse M and the output signal M_EX of the NAND gate ND5 to generate and output a self-refresh pulse SELF_PULSE, in which a pulse exist only when each multi-detection signal M is changed from "high" to "low" states.

The self-refresh pulse SELF_PULSE may be used as a signal controlling a time point at which a refresh operation starts. Further, the self-refresh pulse SELF_PULSE may be a reference with which a refresh cycle is calculated.

That is, the circuit for controlling a self-refresh cycle according to the present invention detects a voltage ΔV charged into a capacitor of a detection cell, in which a voltage ΔV first charged into a capacitor drops to be lower than a minimum sensing voltage VMIN, among a plurality of detection cells, and generates a self-refresh pulse SELF_PULSE. Accordingly, the circuit for controlling a self-refresh cycle according to the present invention can set a refresh cycle longer than a refresh cycle set to have a certain margin considering the charging capacity of a conventional cell. Further, since the detection cell 10 is identically reacted to a change in temperature with a normal cell, the detection cell is adapted to the change of the charging capacity of the cell in accordance with a change in temperature, or the like, so that a refresh cycle can be controlled.

Figure 6:
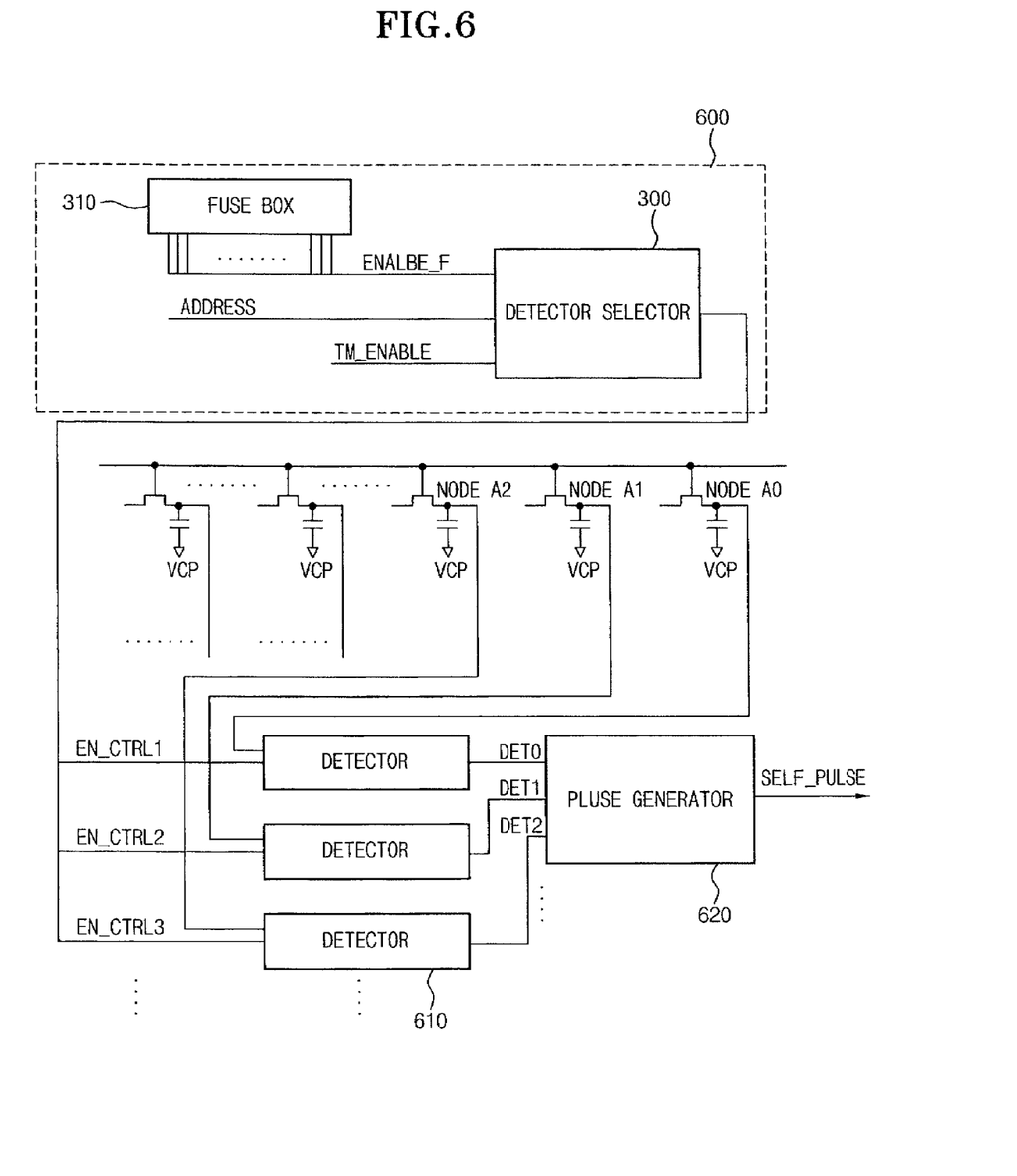
FIG. 6 is a block diagram of a circuit for controlling a self-refresh cycle according to another embodiment of the present invention.

FIG. 6 is a block diagram of a circuit for controlling a self-refresh cycle according to another embodiment of the present invention. The circuit for controlling a self-refresh cycle in FIG. 6 illustrates a case where a detector selection circuit 600 is further included in the circuit for controlling a self-refresh cycle in FIG. 3.

The detector selection circuit 600 includes a detector selector 300 and a fuse box 310. The detector selector 300 receives a test mode signal TM_ENABLE and a address signal ADDRESS to apply an enable control signal EN_CTRL1, EN_CTRL2, EN_CTRL3, . . . to a detector 610 corresponding to the address signal ADDRESS among a plurality of detectors 610

Further, the detector selector 300 may include the fuse box 310 having a plurality of fuses. At this time, a fuse in the fuse box 310 is cut so that an enable control signal EN_CTRL1, EN_CTRL2, EN_CTRL3, . . . can be applied in a "low" level.

In a case where the charging capacity of a detection cell drops below expectation, the circuit for controlling a self-refresh cycle according to another embodiment of the present invention performs the function of excluding the detection cell from the application of detection cells.

An operation of the detector selection circuit will be described below. First, if a test mode signal TM_ENABLE is enabled, an external address signal ADDRESS is decoded such that corresponding detectors are sequentially selected (a corresponding enable control signal is applied in a "high" state). Further, the suitability of a refresh cycle is checked by testing the cycle of a self-refresh pulse SELF_PULSE generated by a detection signal of the detector 610. At this time, the corresponding enable control signal is applied in a "low" state such that other detectors except the detectors selected by the address signal ADDRESS do not operate.

Meanwhile, if a detection cell is determined as an inappropriate detection cell through a test mode, a "low" signal ENABLE_F is applied to a corresponding detector using a cut fuse of the fuse box 310 so that the inappropriate detection cell can be excluded from the plurality of detection cells. The determination of an inappropriate detection cell may be accomplished in accordance with whether or not a refresh cycle estimated with a self-refresh pulse as a reference is suitable for specifications required in semiconductor memories.

since the self-refresh cycle can be variably controlled by directly detecting a cell voltage, a refresh cycle can be set to be longer than a refresh cycle generated by oscillators or the like with a certain margin considering the charging capacity of conventional cells.

Further, there is an advantage in that a detection cell is adapted to the change of the charging capacity of the cell in accordance with a change in temperature without an additional circuit controlling a refresh cycle according to a temperature, or the like, so that an appropriate refresh cycle can be set.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A circuit for controlling a self-refresh cycle of a DRAM, comprising:
   a plurality of detectors each detecting whether or not a voltage charged into a capacitor of a detection cell drops to, or below, a reference voltage and to output a detection signal in response thereto; and
   a pulse generator coupled to at least one of the plurality of detectors and which generates a self-refresh pulse for performing self refresh operation while linked with an enabled detection signal from at least one of the plurality of detectors.

2. The circuit for controlling a self-refresh cycle as set forth in claim 1, wherein the detection cell includes a dummy cell.

3. The circuit for controlling a self-refresh cycle as set forth in claim 1, wherein the reference voltage is a minimum voltage level, VMIN that is capable of being sensed by a sense amplifier.

4. The circuit for controlling a self-refresh cycle as set forth in claim 3, wherein the detector includes a differential amplifier comparing a voltage in which the voltage at a storage node of the detection cell is dropped as low as the minimum sensing voltage with a cell plate voltage so as to output the detection signal.

5. The circuit for controlling a self-refresh cycle as set forth in claim 4, wherein the detector is driven by a control signal.

6. The circuit for controlling a self-refresh cycle as set forth in claim 5, further comprising a detector selection circuit receiving a test mode signal and an address signal to apply the control signal to a detector corresponding to the address signal among the plurality of detectors.

7. The circuit for controlling a self-refresh cycle as set forth in claim 6, wherein the detector selection circuit includes a fuse box having a plurality of fuses, and outputs the control signal in an enable state corresponding to the cut fuse.

8. The circuit for controlling a self-refresh cycle as set forth in claim 4, wherein the detector further includes an initialization circuit initializing an output terminal of the differential amplifier by a reset signal.

9. The circuit for controlling a self-refresh cycle as set forth in claim 4, wherein the detector further includes a latch, which latches an output signal of the differential amplifier.

10. The circuit for controlling a self-refresh cycle as set forth in claim 1, wherein the pulse generator includes: a detection signal input unit generating a detection pulse with an enable state linked with an enabled detection signal of the plurality of detectors;
a delay unit outputting a delay detection pulse in which the detection pulse is delayed by a predetermined time; and
a self-refresh pulse generator performing an exclusive OR operation with respect to the detection pulse and the delay detection pulse to generate the self-refresh pulse.

11. The circuit for controlling a self-refresh cycle as set forth in claim 10, wherein the detection signal input unit includes: a plurality of NAND gates grouping the detection signals of the plurality of detectors to perform a NAND operation; and
a NOR gate performing a NOR operation with respect to output signals of the plurality of NAND gates to be output as the detection pulse.

12. The circuit for controlling a self-refresh cycle as set forth in claim 10, wherein the predetermined time corresponds to the width of the self-refresh pulse.

13. The circuit for controlling a self-refresh cycle as set forth in claim 10, wherein the self-refresh pulse generator includes: a first NAND gate performing a NAND operation with respect to the detection pulse and the delay detection pulse;
first and second inverters respectively inverting the detection pulse and the delay detection pulse;
a second NAND gate performing a NAND operation with respect to outputs of the first and second inverters;
a third NAND gate performing a NAND operation with respect to outputs of the first and second NAND gates; and
a NOR gate performing a NOR operation with respect to the detection pulse and an output of the third NAND gate.

14. A method for controlling a self-refresh cycle, comprising the steps of:
a first step of comparing the voltages respectively charged into capacitors of a plurality of detection cells to output a plurality of detection signals corresponding to the compared results; and
a second step of generating a self-refresh pulse for performing self refresh while being linked with the plurality of enabled detection signals.

15. The method for controlling a self-refresh cycle as set forth in claim 14, wherein the reference voltage in the first step is set to be a minimum sensing voltage capable of being sensed by a sense amplifier.

16. The method for controlling a self-refresh cycle as set forth in claim 15, wherein the detection signal in the first step is output by comparing a voltage in which the voltage at a storage node of the detection cell is dropped as low as the minimum sensing voltage with a cell plate voltage.

17. The method for controlling a self-refresh cycle as set forth in claim 16, wherein the detection signal in the first step is latched to be output.

18. The method for controlling a self-refresh cycle as set forth in claim 14, wherein the second step includes the steps of: receiving the plurality of detection signals to generate a detection pulse by at least one or more enabled detection signals;
outputting the detection pulse to the delay detection pulse by delaying for a predetermined time; and
performing an exclusive OR operation with respect to the detection pulse and the delay detection pulse to generate the self-refresh pulse.

19. The method for controlling a self-refresh cycle as set forth in claim 18, wherein the detection pulse is output by grouping the plurality of detection signals to perform a plurality of NAND operations and performing a NOR operation with respect to the plurality of NAND-operated output signals.

20. The method for controlling a self-refresh cycle as set forth in claim 18, wherein the delay detection pulse is output by delaying the detection pulse by the width of the self-refresh pulse.

21. The method for controlling a self-refresh cycle as set forth in claim 18, wherein the exclusive OR operation includes the steps of: performing a first NAND operation with respect to the detection pulse and the delay detection pulse;
inverting the respective detection pulse and delay detection pulse to perform a second NAND operation;
performing a third NAND operation with respect to the first and second NAND-operated signals; and
performing a NOR operation with respect to the detection pulse and the third NAND-operated signal to output the self-refresh pulse.

* * * * *